(12) United States Patent
Lopatin et al.

(10) Patent No.: US 6,515,368 B1
(45) Date of Patent: Feb. 4, 2003

(54) SEMICONDUCTOR DEVICE WITH COPPER-FILLED VIA INCLUDES A COPPER-ZINC/ALLOY FILM FOR REDUCED ELECTROMIGRATION OF COPPER

(75) Inventors: Sergey Lopatin, Santa Clara, CA (US); Alexander H. Nickel, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/016,410

(22) Filed: Dec. 7, 2001

(51) Int. Cl.$^7$ .............................................. H01L 23/532
(52) U.S. Cl. ...................... 257/762; 257/751; 257/752; 257/767; 257/775
(58) Field of Search ................................. 251/751, 752, 251/758, 760, 761, 762, 764, 767, 775

(56) References Cited

U.S. PATENT DOCUMENTS

| | | | |
|---|---|---|---|
| 6,022,808 A | | 2/2000 | Nogami et al. |
| 6,181,012 B1 | * | 1/2001 | Edelstein et al. ............ 257/762 |
| 6,197,181 B1 | | 3/2001 | Chen |
| 6,249,055 B1 | * | 6/2001 | Dubin ......................... 257/758 |
| 6,319,387 B1 | * | 11/2001 | Krishnamoorthy et al. . 205/240 |
| 6,368,966 B1 | * | 4/2002 | Krishnamoorthy et al. . 438/687 |
| 2002/0074234 A1 | * | 6/2002 | Dubin et al. ................. 205/182 |

OTHER PUBLICATIONS

Peter Van Zant, Microchip Fabrication: A Practical Guide to Semiconductor Processing, 3$^{rd}$ Ed., p. 392, 397 (1997).

A. Krishnamoorthy, D. Duquette and S. Murarka, Electrochemical Codeposition and Electrical Characterization of a Copper–Zinc Alloy Metallization, in edited by Adricacos et al. Electrochem. Soc. Symp Procedings vol. 99–9, May 3–6, Seattle, p. 212(1999)(Abstract).

J. Cunningham, Using Electrochemistry to Improve Copper Interconnect, in J. Semiconductor International, Spring 2000 (May), pp. 97–98,100,102.

Lin Lin Chen and T. Ritzdorf, "ECD Seed Layer for In–Laid Copper Metallization" in edited by Andricacos et. al., Electrochem Society Proceedings vol. 99–9, Seattle Symphony May 3–6, 1999, p. 122 (Abstract).

* cited by examiner

*Primary Examiner*—Carl Whitehead, Jr.
*Assistant Examiner*—Stephen W. Smoot
(74) *Attorney, Agent, or Firm*—LaRiviere, Grubman & Payne, LLP

(57) ABSTRACT

A method of reducing electromigration in copper interconnect lines by restricting Cu-diffusion pathways along a Cu surface via doping the Cu surface with Zn from an interim copper-zinc alloy (Cu—Zn) thin film electroplated on the copper (Cu) surface from a stable chemical solution, and controlling the Zn-doping thereof, which also improves interconnect reliability and corrosion resistance, and a semiconductor device thereby formed. The method involves using interim reduced-oxygen Cu—Zn alloy thin films for forming an encapsulated dual-inlaid interconnect structure. The films are formed by electroplating a Cu surface via by electroplating, the Cu surface in a unique chemical solution containing salts of Zn and Cu, their complexing agents, a pH adjuster, and surfactants; and annealing the interim electroplated Cu—Zn alloy thin films and a Cu-fill; and planarizing the interconnect structure.

10 Claims, 5 Drawing Sheets

Figure 1:
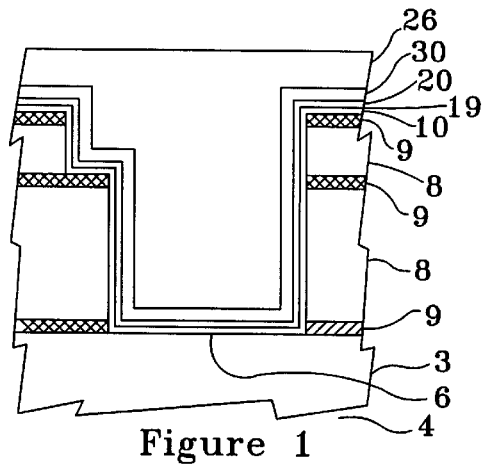

SEMICONDUCTOR DEVICE WITH COPPER-FILLED VIA INCLUDES A COPPER-ZINC/ALLOY FILM FOR REDUCED ELECTROMIGRATION OF COPPER

CROSS-REFERENCE TO RELATED APPLICATION(S)

This application is also related to the following commonly assigned applications:

(1) U.S. Ser. No. 10/081,074, entitled "Chemical Solution for Electroplating a Copper-Zinc Alloy Thin Film, filed Feb. 21, 2002;"

(2) U.S. Ser. No. 10/082,432, entitled "Method of Electroplating a Copper-Zinc Alloy Thin Film on a Copper Surface Using a Chemical Solution and a Semiconductor Device thereby Formed, filed Feb. 22, 2002;"

(3) U.S. Ser. No. 10/082,433, entitled "Method of Controlling Zinc-Doping in a Copper-Zinc Alloy Thin Film Electroplated on a Copper Surface and a Semiconductor Device thereby Formed, filed Feb. 22, 2002;"

(4) U.S. Ser. No. 10/083,809, entitled "Method of Reducing Electromigration in a Copper Line by Electroplating an Interim Copper-Zinc Alloy Thin Film on a Copper Surface and a Semiconductor Device thereby Formed, filed Feb. 26, 2002;"

(5) U.S. Ser. No. 10/084,563, entitled "Method of Reducing Electromigration by Forming an Electroplated Copper-Zinc Interconnect and a Semiconductor Device thereby Formed, filed Feb. 26, 2002;" and (6) U.S. Ser. No. 10/016,645, entitled "Method of Reducing Electromigration by Ordering Zinc-Doping in an Electroplated Copper-Zinc Interconnect and a Semiconductor Device thereby Formed, filed Dec. 7, 2001."

FIELD OF THE INVENTION

The present invention relates to semiconductor devices and their methods of fabrication. More particularly, the present invention relates to the processing of copper interconnect material and the resultant device utilizing the same. Even more particularly, the present invention relates to reducing electromigration in copper interconnect lines by doping their surfaces with a barrier material using wet chemical methods.

BACKGROUND OF THE INVENTION

Currently, the semiconductor industry is demanding faster and denser devices (e.g., 0.05 $\mu$m to 0.25 $\mu$m) which implies an ongoing need for low resistance metallization. Such need has sparked research into resistance reduction through the use of barrier metals, stacks, and refractory metals. Despite aluminum's (Al) adequate resistance, other Al properties render it less desirable as a candidate for these higher density devices, especially with respect to its deposition into plug regions having a high aspect ratio cross-sectional area. Thus, research into the use of copper as an interconnect material has been revisited, copper being advantageous as a superior electrical conductor, providing better wettability, providing adequate electromigration resistance, and permitting lower depositional temperatures. The copper (Cu) interconnect material may be deposited by chemical vapor deposition (CVD), plasma-enhanced chemical vapor deposition (PECVD), sputtering, electroless plating, and electrolytic plating.

However, some disadvantages of using Cu as an interconnect material include etching problems, corrosion, and diffusion into silicon.[1] These problems have instigated further research into the formulation of barrier materials for preventing electromigration in both Al and Cu interconnect lines. In response to electromigration concerns relating to the fabrication of semiconductor devices particularly having aluminum-copper alloy interconnect lines, the industry has been investigating the use of various barrier materials such as titanium-tungsten (TiW) and titanium nitride (TiN) layers as well as refractory metals such as titanium (Ti), tungsten (W), tantalum (Ta), molybdenum (Mo), and their silicides.[2] Although the foregoing materials are adequate for Al interconnects and Al—Cu alloy interconnects, they have not been entirely effective

[1] Peter Van Zant, Microchip Fabrication: A Practical Guide to Semiconductor Processing, 3$_{rd}$ Ed., p. 397 (1997).
[2] Id., at 392. with respect to all-Cu interconnects. Further, though CVD and PECVD have been conventionally used for depositing secondary metal(s) on a primary metal interconnect surface, neither technique provides a cost-effective method of forming a copper-zinc alloy on a Cu interconnect surface. Therefore, a need exists for a low cost and high throughput method of reducing electromigration in copper interconnect lines by restricting Cu-diffusion pathways along a Cu surface via doping the Cu surface with Zn from an interim copper-zinc (Cu—Zn) alloy thin film electroplated on the copper (Cu) surface from a stable chemical solution, and controlling the Zn-doping thereof, which also improves interconnect reliability and corrosion resistance.

BRIEF SUMMARY OF THE INVENTION

Accordingly, the present invention provides a method of reducing electromigration in copper interconnect lines by restricting Cu-diffusion pathways along a Cu surface via doping the Cu surface with Zn from an interim copper-zinc (Cu—Zn) alloy thin film electroplated on the copper (Cu) surface from a stable chemical solution, and controlling the Zn-doping thereof, which also improves interconnect reliability and corrosion resistance, and a semiconductor device thereby formed. The present method involves electroplating by immersing the Cu surface, such as a blanket Cu seed layer and a partial thickness plated Cu layer, into a unique nontoxic aqueous chemical electroplating solution containing salts of zinc (Zn) and copper (Cu), their complexing agents, a pH adjuster, and surfactants, thereby forming an interim Cu—Zn alloy thin film having some degree of oxygen (O) concentration, wherein the Zn-doping is controllable by varying the electroplating conditions; and annealing the interim Cu—Zn alloy thin film formed on the Cu surface in an environment such as vacuum, nitrogen ($N_2$), hydrogen ($H_2$), formine ($N_2H_2$), or mixtures thereof for reducing the O-concentration in the alloy thin film layer, for modifying the grain structure of the Cu—Zn alloy thin film as well as of the underlying Cu surface, and for forming a mixed Cu—Zn/Cu interface; and further electroplating the alloy thin film layer with Cu for completely filling the via, thereby forming the interconnect structure. The present invention further provides a particular electroplating method which controls the parameters of Zn concentration, pH, temperature, and time in order to form a uniform reduced-oxygen copper-zinc alloy (Cu—Zn) thin film on a cathode-wafer surface such as a copper (Cu) surface for reducing electromigration in the device by decreasing the drift velocity therein which decreases the Cu migration rate in addition to decreasing the void formation rate.

More specifically, the present invention provides a method of fabricating a semiconductor device, having a first interim reduced-oxygen copper-zinc alloy (Cu—Zn) thin film formed on a copper (Cu) surface and a second interim reduced-oxygen Cu—Zn alloy thin film formed on a Cu-fill, both films being formed by electroplating the Cu surface and the Cu-fill, respectively, in a chemical solution, generally comprising the steps of: providing a semiconductor substrate having a Cu surface, an optional barrier layer, and an optional underlayer formed in a via; providing a chemical solution; immersing the Cu surface in the chemical solution, thereby forming a first interim Cu—Zn alloy thin film on the Cu surface; rinsing the first interim Cu—Zn alloy thin film in a solvent; drying the first interim Cu—Zn alloy thin film under a gaseous flow; annealing the first interim Cu—Zn alloy thin film formed on the Cu surface, thereby forming a first interim reduced-oxygen Cu—Zn alloy thin film; filling the via with Cu on the first interim reduced-oxygen Cu—Zn alloy thin film, thereby forming a Cu-fill; annealing the Cu-fill, the first interim reduced-oxygen Cu—Zn alloy thin film, the Cu surface, the optional barrier layer, and the optional underlayer; immersing the annealed Cu-fill in the chemical solution, thereby forming a second interim Cu—Zn alloy thin film on the annealed Cu-fill; rinsing the second interim Cu—Zn alloy thin film in a solvent; drying the second interim Cu—Zn alloy thin film under a gaseous flow, for instance, under a gaseous nitrogen flow ($GN_2$); annealing second interim Cu—Zn alloy thin film formed on the Cu-fill, thereby diffusing a plurality of Zn ions from the second interim Cu—Zn alloy thin film into the Cu-fill, and thereby forming a second interim reduced-oxygen Cu—Zn alloy thin film comprising the second interim Cu—Zn alloy thin film as well as an upper portion of the Cu-fill; planarizing second interim reduced-oxygen Cu—Zn alloy thin film, the Cu-fill, the first interim reduced-oxygen Cu—Zn alloy thin film, the Cu surface, the optional barrier layer, and the optional underlayer, thereby forming an encapsulated dual-inlaid interconnect structure; and completing formation of the semiconductor device.

By electroplating this Cu—Zn alloy thin film on the cathode-wafer surface such as a Cu surface using a stable chemical solution in the prescribed concentration ranges and by subsequently annealing the Cu—Zn alloy thin film electroplated on the Cu surface, the present invention improves Cu interconnect reliability, enhances electromigration resistance, improves corrosion resistance, and reduces manufacturing costs. In particular, the present invention chemical solution is advantageous in that it facilitates formation of an acceptable Cu—Zn alloy thin film over a wide range of bath compositions while the subsequent annealing step removes undesirable oxygen impurities from the formed alloy thin film. The desirable Zn concentration in the Cu—Zn alloy thin film, preferably in a range of approximately 0.2 at. % to approximately 9.0 at. % determined by X-Ray Photoelectron Spectroscopy (XPS) or Auger Electron Spectroscopy (AES), is controllable by varying the electroplating conditions and/or the bath composition. By so controlling the Zn-doping, the present method balances high electromigration performance against low resistivity requirements. Additionally, the Cu surface (e.g., seed layer), being formed by a technique such as electroless deposition, ion metal plasma (IMP), self-ionized plasma (SIP), hollow cathode magnetron (HCM), chemical vapor deposition (CVD), and atomic layer deposition (ALD), is enhanced by the Cu—Zn alloy thin film and is prevented from etching by the high pH value (i.e., basic) of the chemical solution from which the alloy thin film is formed.

Further advantages arise from the present invention's superior fill-characteristics. The present Cu—Zn electroplating solution facilitates better filling of a Cu—Zn alloy thin film on an interconnect, especially for feature sizes in a dimensional range of approximately 0.2 $\mu$m to approximately 0.05 $\mu$m, thereby lowering the resistance of the formed Cu—Zn alloy thin film (e.g., in a resistance range of approximately 2.2 $\mu\Omega\cdot$cm to approximately 2.5 $\mu\Omega\cdot$cm for approximately 1 at. % Zn content in a Cu—Zn alloy thin film, as deposited). Further, the filling capability is enhanced by three beneficial characteristics of the present invention: (1) the instant chemical solution does not etch copper or a copper alloy seed layer; (2) the introduction of Zn into the alloy thin film as well as onto the Cu interconnect improves both step coverage and nucleation; and (3) a variety of organic additives, such as polyethylene glycol (PEG), organo-disulfides, and organo-chlorides, are compatible and maybe included in the instant chemical solution for further enhancing the fill profile and grain structure. The present Cu—Zn electroplating solution provides a desirably low Zn content in a Cu alloy interconnect (e.g., in a concentration range of approximately 0.2 at. % to approximately 1.0 at. %) which also imparts (1) a de minimis increase in resistance as well as (2) a maximum improvement in electromigration resistance. The present chemical solution can also provide a desirably low Zn content (e.g., in a range of <<approximately 0.1 at. % or <<approximately 0.2 at. %, virtually undetectable by AES) in a Cu film, wherein the Zn content may be engineered by varying the deposition parameters as well as by modifying the bath composition.

BRIEF DESCRIPTION OF THE DRAWING(S)

For a better understanding of the present invention, reference is made to the below-referenced accompanying drawings. Reference numbers refer to the same or equivalent parts of the present invention throughout the several figures of the drawings.

(1) FIG. 1 is a cross-sectional view of a Cu interconnect line formed on a semiconductor substrate and acting as the bottom portion of a via, the via sidewalls comprising at least one low dielectric constant layer and at least one high dielectric constant step layer, the via having an optional barrier layer formed therein, an optional underlayer formed on the optional barrier layer, and a Cu surface (e.g., a seed layer) formed on the optional underlayer, a first interim Cu—Zn alloy thin film formed and annealed on the Cu surface, and a Cu-fill formed on the first interim Cu—Zn alloy thin film, in accordance with a first embodiment of the present invention.

Figure 2:
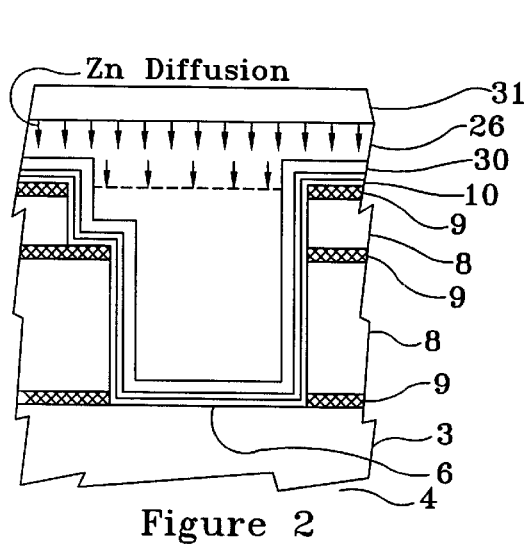

(2) FIG. 2 is a cross-sectional view of the features as shown in FIG. 1, further having a second interim Cu—Zn alloy thin film formed and annealed on the Cu-fill, having Zn diffusion down (Zn-doping) into an upper portion of the Cu-fill, in accordance with the first embodiment of the present invention.

Figure 3:
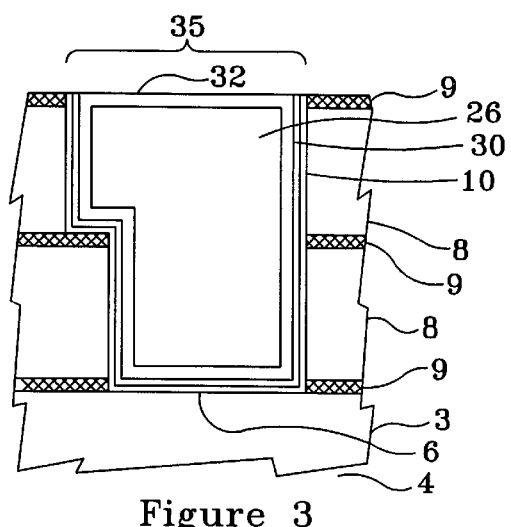

(3) FIG. 3 is a cross-sectional view of the features as shown in FIG. 2, further having been planarized which forms an encapsulated dual-inlaid interconnect structure, in accordance with the first embodiment of the present invention.

Figure 4:
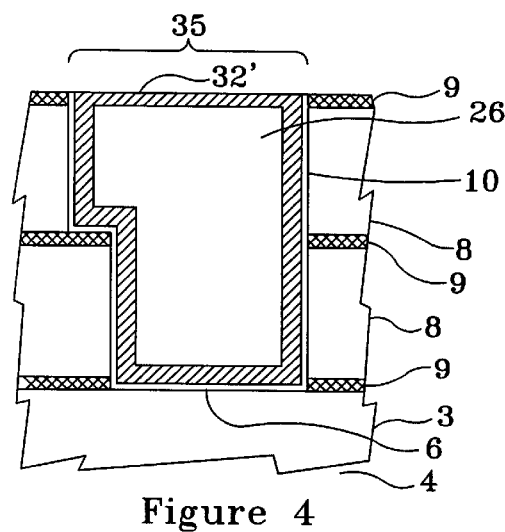

(4) FIG. 4 is a cross-sectional view of the features of FIG. 3, wherein the encapsulated dual-inlaid interconnect structure comprises a mixed layer, and wherein the mixed layer comprises the annealed and planarized second interim Cu—Zn alloy thin film and the first interim Cu—Zn alloy thin film , and the Cu-fill, in accordance with the first embodiment of the present invention.

Figure 5:
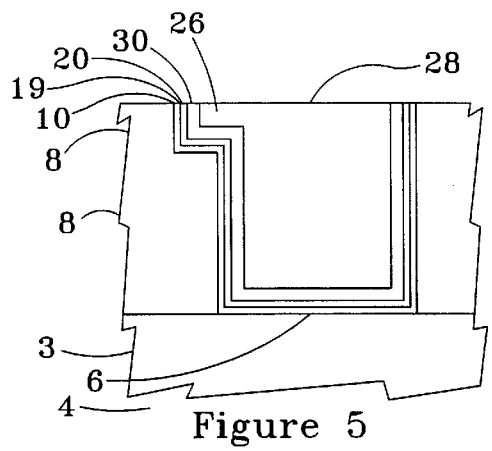

(5) FIG. 5 is a cross-sectional view of a Cu interconnect line formed on a semiconductor substrate and acting as the bottom portion of a via, the via sidewalls comprising at least one low dielectric constant layer, the via having an optional barrier layer formed therein, an optional underlayer formed on the optional barrier layer, and a Cu surface (e.g., a seed layer) formed on the optional underlayer, a first interim Cu—Zn alloy thin film formed and annealed on the Cu surface, and a Cu-fill formed first interim Cu—Zn alloy thin film, the first interim Cu—Zn alloy thin film, the Cu-fill, the Cu surface, the optional underlayer, and the optional barrier layer having been planarized to form an intermediate planarized surface, in accordance with a second embodiment of the present invention.

Figure 6:
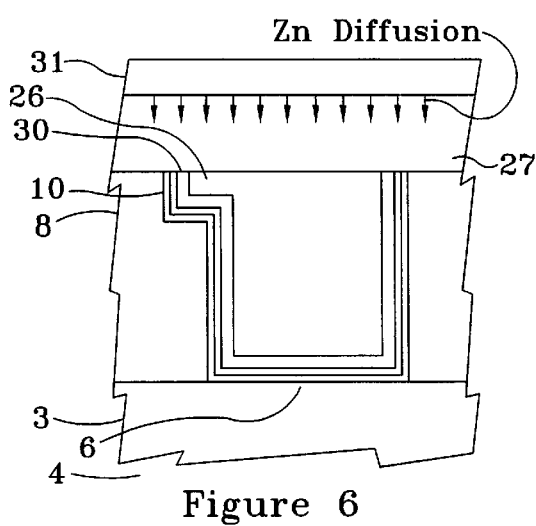

(6) FIG. 6 is a cross-sectional view of the features as shown in FIG. 5, further having a Cu layer deposited on the intermediate planarized surface a second interim Cu—Zn alloy thin film formed and annealed on the Cu layer, and having Zn diffusion down (Zn-doping) through the Cu layer and into an upper portion of the Cu-fill, in accordance with the second embodiment of the present invention.

Figure 7:
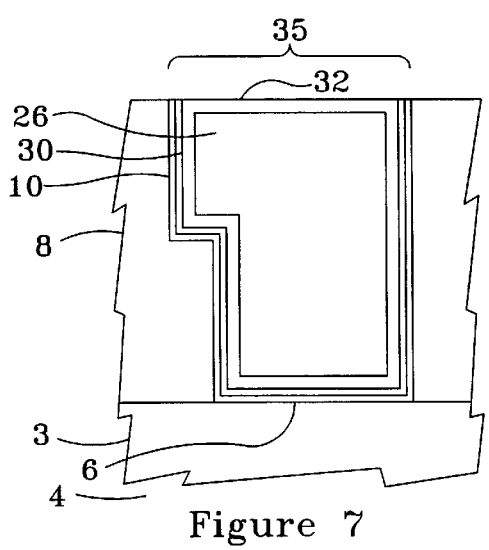

(7) FIG. 7 is a cross-sectional view of Figure the features as shown in 6, having been further planarized which forms an encapsulated dual-inlaid interconnect structure, in accordance with the second embodiment of the present invention.

Figure 8:
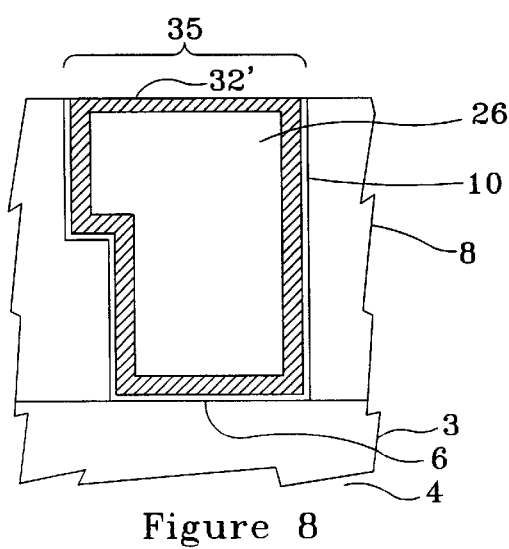

(8) FIG. 8 is a cross-sectional view of the features of FIG. 7, wherein the encapsulated dual-inlaid interconnect structure comprises a mixed layer, and wherein the mixed layer comprises the annealed and planarized second interim Cu—Zn alloy thin film and the first interim Cu—Zn alloy thin film, and the Cu-fill, in accordance with the second embodiment of the present invention.

Figure 9:
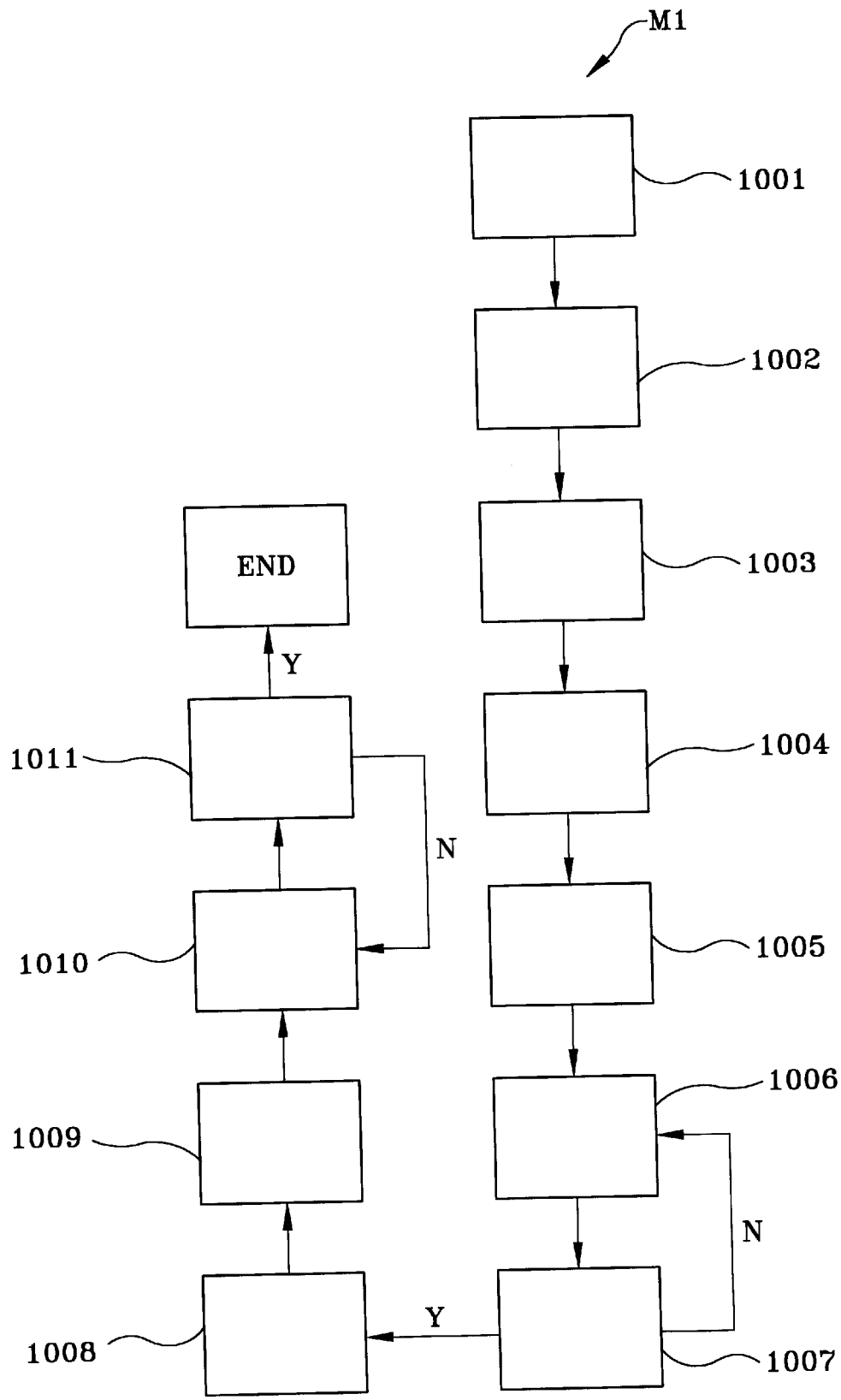

(9) FIG. 9 is a flowchart of a method for synthesizing a unique nontoxic aqueous Cu—Zn electroplating (chemical) solution, in accordance with the present invention.

Figure 10:
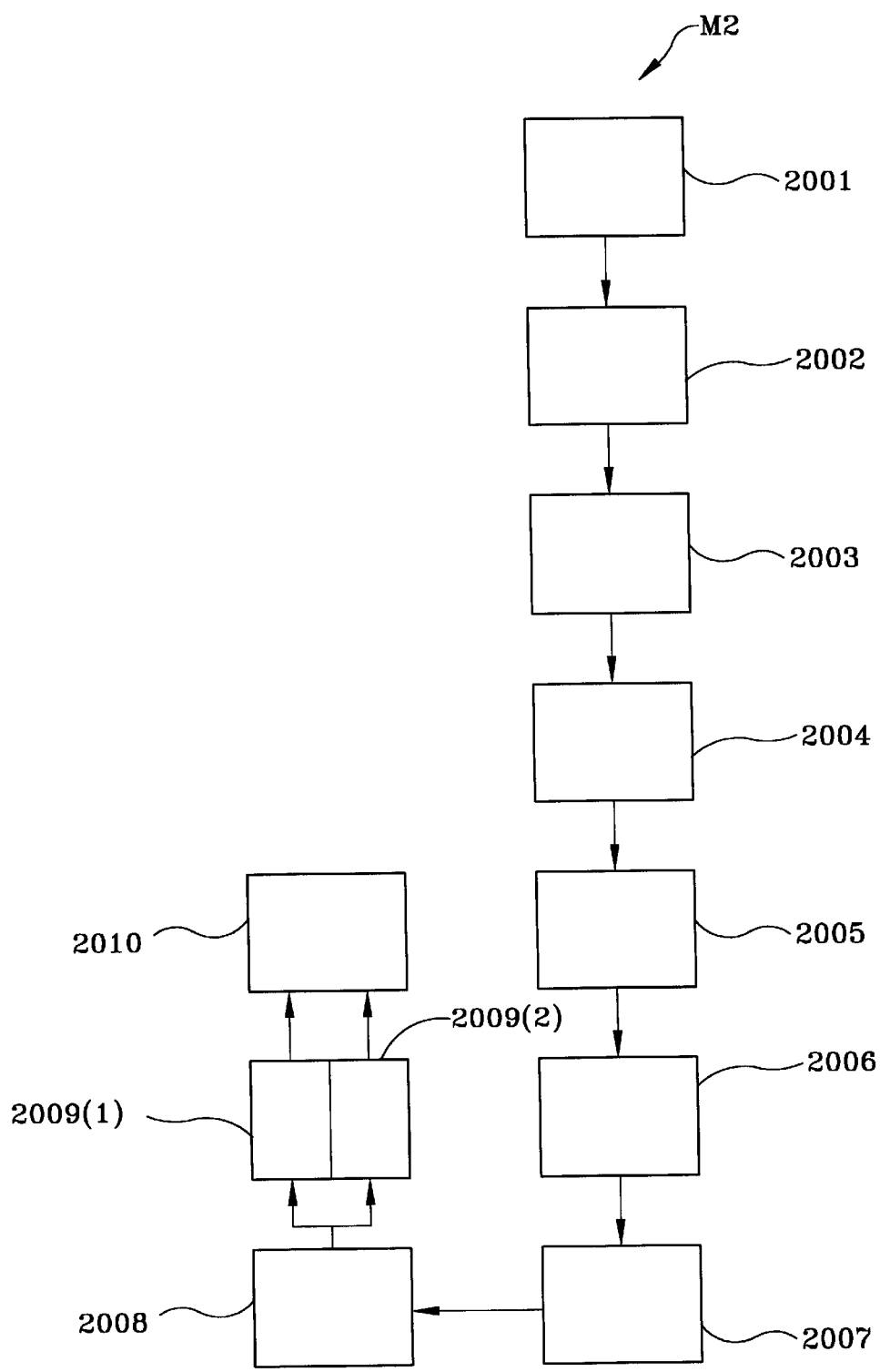

(10) FIG. 10 is a flowchart of a method for forming a Cu—Zn alloy thin film on a Cu surface, in accordance with the present invention.

Figure 11:
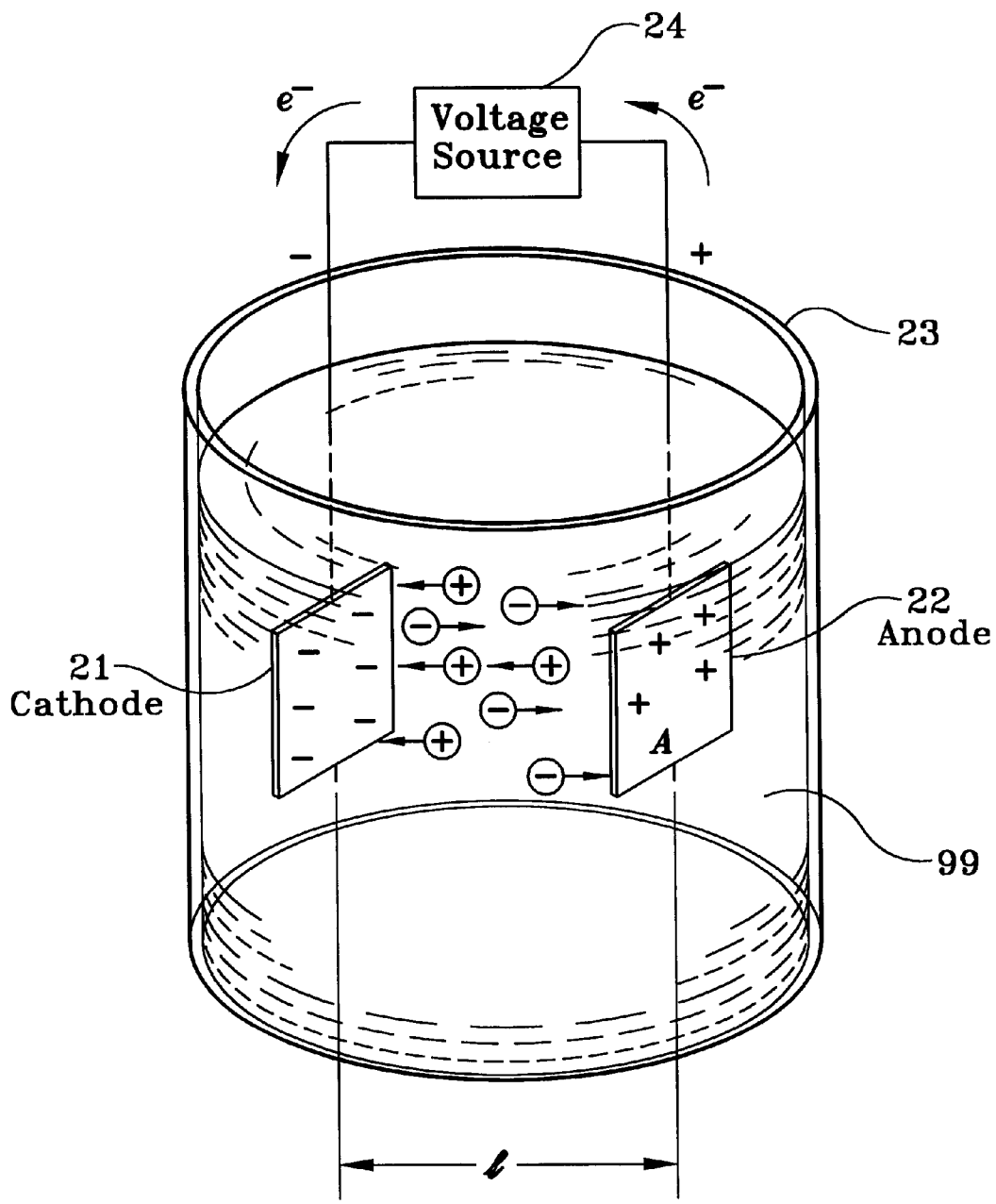

(11) FIG. 11 is a perspective view of an electroplating apparatus using the unique nontoxic aqueous Cu—Zn chemical solution, in accordance with the present invention.

DETAILED DESCRIPTION OF THE INVENTION

FIG. 1 illustrates, by example only, a cross-section of a Cu interconnect line 3 formed on a semiconductor substrate 4 and acting as the bottom portion of a via 6, the via 6 sidewalls comprising at least one low dielectric constant layer 8 and at least one high dielectric constant step layer 9, the via 6 having an optional barrier layer 10 formed therein, an optional underlayer 19 formed on the optional barrier layer 10, and a Cu surface (e.g., a seed layer) 20 in a thickness range of approximately 100 Å to approximately 300 Å formed on the optional underlayer 19, a first interim Cu—Zn alloy thin film 30 formed and annealed on the Cu surface 20, and a Cu-fill 26 formed on the first interim Cu—Zn alloy thin film 30, in accordance with a first embodiment of the present invention. The optional barrier layer 10 comprises at least one material selected from a group consisting essentially of titanium silicon nitride ($Ti_xSi_yN_z$) tantalum nitride (TaN), and tungsten nitride ($W_x$, $N_y$) has a thickness range of approximately 10 Å to approximately 30 Å and is formed by a technique such as atomic layer deposition (ALD), atomic layer chemical vapor deposition (ALCVD), or chemical vapor deposition (CVD). The optional underlayer 19 comprises at least one material selected from a group consisting essentially of tin (Sn) and Palladium (Pd) in a thickness range of approximately 10 Å approximately 30 Å.

FIG. 2 illustrates, in cross-section, the features of FIG. 1, further having a second interim Cu—Zn alloy thin film 31 formed and annealed on the Cu-fill 26, having Zn diffusion down (Zn-doping) into an upper portion of the Cu-fill, 26 in accordance with the first embodiment of the present invention. The optional underlayer 19 is not shown.

FIG. 3 illustrates, in cross-section, the features of FIG. 2, further having been planarized which forms an annealed and planarized second interim Cu—Zn alloy thin film 32 and an encapsulated dual-inlaid interconnect structure 35, in accordance with the first embodiment of the present invention. The optional underlayer 19 is not shown.

FIG. 4 illustrates, in cross-section, the features of FIG. 3, wherein the encapsulated dual-inlaid interconnect structure 35 comprises a mixed layer 32' and the Cu-fill 26, wherein the mixed layer 32' comprises the annealed and planarized second interim Cu—Zn alloy thin film 32 and the first interim Cu—Zn alloy thin film 30, in accordance with the first embodiment of the present invention. The encapsulated dual-inlaid interconnect structure 35 may also comprise the optional barrier layer 10 and the optional underlayer 19 (not shown).

FIG. 5 illustrates, by example only, a cross-section of a Cu interconnect line 3 formed on a semiconductor substrate 4 and acting as the bottom portion of a via 6, the via 6 sidewalls comprising at least one low dielectric constant layer 8, the via 6 having an optional barrier layer 10 formed therein, an optional underlayer 19 formed on the optional barrier layer 10, and a Cu surface (e.g., a seed layer) 20 in a thickness range of approximately 100 Å to approximately 300 Å formed on the optional underlayer 19, a first interim Cu—Zn alloy thin film 30 formed and annealed on the Cu surface 20, and a Cu-fill 26 formed on the first interim Cu—Zn alloy thin film 30, the first interim Cu—Zn alloy thin film 30, the Cu-fill 26, the Cu surface 20, the optional underlayer 19, and the optional barrier layer 10 having been planarized to form an intermediate planarized surface 28, in accordance with a second embodiment of the present invention. The optional barrier layer 10, comprising at least one material selected from a group consisting essentially of titanium silicon nitride ($Ti_xSi_yN_z$), tantalum nitride (TaN), and tungsten nitride ($W_x,N_y$) has a thickness range of approximately 10 Å to approximately 30 Å and is formed by a technique such as atomic layer deposition (ALD), atomic layer chemical vapor deposition (ALCVD), or chemical vapor deposition (CVD). The optional underlayer 19 comprises at least one material selected from a group consisting essentially of tin (Sn) and Palladium (Pd) in a thickness range of approximately 10 Å to approximately 30 Å.

FIG. 6 illustrates, in cross-section, the features of FIG. 5, further having a Cu layer 27 deposited on the intermediate planarized surface 28, a second interim Cu—Zn alloy thin film 31 formed and annealed on the Cu layer 27, and having Zn diffusion down (Zn-doping) through the Cu layer 27 and into an upper portion of the Cu-fill 26, in accordance with the second embodiment of the present invention.

FIG. 7 illustrates, in cross-section, the features of FIG. 6, having been further planarized which forms an annealed second interim Cu—Zn alloy thin film 32 and an encapsulated dual-inlaid interconnect structure 35, in accordance with the second embodiment of the present invention.

FIG. 8 illustrates, in cross-section, the features of FIG. 7, wherein the encapsulated dual-inlaid interconnect structure 35 comprises a mixed layer 32' and the Cu-fill 26, wherein the mixed layer 32' comprises the annealed and planarized second interim Cu—Zn alloy thin film 32 and the first interim Cu—Zn alloy thin film 30, in accordance with the second embodiment of the present invention. The encapsulated dual-inlaid interconnect structure 35 may also comprise the optional barrier layer 10 and the optional underlayer 19 (not shown).

FIG. 9 flowcharts, by example only, a method M1 for synthesizing a liter of a unique nontoxic aqueous Cu—Zn electroplating (chemical) solution, in accordance with the present invention:

(1) cleaning a mixing vessel (e.g., a beaker) with dilute nitric acid ($HNO_3$) for approximately 5 minutes, as indicated by block 1001;

(2) rinsing the mixing vessel in deionized (DI) water for approximately 5 minutes to approximately 10 minutes and subsequently drying the mixing vessel, for instance, under a gaseous nitrogen ($GN_2$) flow, as indicated by block 1002;

(3) adding an initial volume of DI water (e.g., approximately 400 ml) to the mixing vessel, as indicated by block 1003;

(4) adding at least one Cu ion source for providing a plurality of Cu ions and stirring the at least one Cu ion source into the DI water for a duration in a range of approximately 5 minutes to approximately 10 minutes or until complete dissolution of the at least one Cu ion source in the DI water is achieved, as indicated by block 1004;

(5) adding at least one complexing agent for complexing the plurality of Cu ions and stirring the at least one complexing agent until complete dissolution of the at least one complexing agent in the DI water is achieved, as indicated by block 1005;

(6) adding at least one pH adjuster and stirring the at least one pH adjuster into the DI water for a duration in a range of approximately 5 minutes to approximately 10 minutes or until a clean and transparent solution is achieved, as indicated by block 1006;

(7) measuring the pH of the solution, and, if the pH is within the desired range, proceeding to step (8), otherwise titrating the solution with a small volume of the at least one pH adjuster until the pH falls within the desired range, in essence, returning to step (6), as indicated by block 1007;

(8) adding at least one Zn ion source for providing a plurality of Zn ions and stirring the at least one Zn ion source into the DI water for a duration in a range of approximately 5 minutes to approximately 10 minutes or until complete dissolution of the at least one Zn ion source in the DI water is achieved, as indicated by block 1008;

(9) adding a final volume of DI water (e.g., effecting approximately 1 L in total solution volume) to the mixing vessel, as indicated by block 1009;

(10) optionally adding at least one complexing agent for complexing the plurality of Zn ions and stirring the at least one complexing agent until complete dissolution of the at least one complexing agent in the DI water is achieved, as indicated by block 1010; and

(11) measuring the pH of the solution, and, if the pH is within the desired range, terminating the synthesis, otherwise further titrating the solution with a small volume of the at least one pH adjuster until the pH falls within the desired range, in essence, returning to step (10), as indicated by block 1011.

In addition, the present invention chemical solution may be formulated as follows: wherein the at least one zinc (Zn) ion source comprises at least one zinc salt selected from a group consisting essentially of zinc acetate (($CH_3CO_2)_2Zn$), zinc bromide ($ZnBr_2$), zinc carbonate hydroxide ($ZnCO_3 \cdot 2Zn(OH)_2$), zinc dichloride ($ZnCl_2$), zinc citrate ($O_2CCH_2C(OH)(CO_2)CH_2CO_2)_2Zn_3$), zinc iodide ($ZnI_2$), zinc L-lactate (($CH_3CH(OH)CO_2)_2Zn$), zinc nitrate ($Zn(NO_3)_2$), zinc stearate (($CH_3(CH_2)_{16}CO_2)_2Zn$), zinc sulfate ($ZnSO_4$), zinc sulfide ($ZnS$), zinc sulfite ($ZnSO_3$), and their hydrates (preferably zinc chloride or zinc dichloride and zinc citrate), wherein the at least one complexing agent for complexing the plurality of Zn ions comprises tartaric acid ($HO_2CCH(OH)CH(OH)CO_2H$), wherein the tartaric acid prevents precipitation of the plurality of Zn ions from the chemical solution, wherein the at least one copper (Cu) ion source comprises at least one copper salt selected from a group consisting essentially of copper(I) acetate ($CH_3CO_2Cu$), copper(II) acetate (($CH_3CO_2)_2Cu$), copper(I) bromide ($CuBr$), copper(II) bromide ($CuBr_2$), copper(II) hydroxide ($Cu(OH)_2$), copper(II) hydroxide phosphate ($Cu_2(OH)PO_4$), copper(I) iodide ($CuI$), copper(II) nitrate (($CuNO_3)_2$), copper(II) sulfate ($CuSO_4$), copper(I) sulfide ($Cu_2S$), copper(II) sulfide ($CuS$), copper(II) tartrate (($CH(OH)CO_2)_2Cu$), and their hydrates (preferably copper sulfate), wherein the at least one complexing agent for the plurality of Cu ions comprises at least one species selected from a group consisting essentially of ethylene diamine "EDA" ($H_2NCH_2CH_2NH_2$) and ethylenediaminetetraacetic acid "EDTA" (($HO_2CCH_2)_2NCH_2CH_2N(CH_2CO_2H)_2$), wherein the EDTA prevents precipitation of the plurality of Cu ions from the chemical solution, wherein the at least one pH adjuster comprises at least one pH-adjusting compound selected from a group of pH-adjusting compounds consisting essentially of ammonium hydroxide ($NH_4OH$) and tetramethylammonium hydroxide "TMAH" (($CH_3)_4NOH$), wherein the at least one wetting agent comprises a surfactant, and wherein the surfactant comprises at least one surfactant selected from a group consisting essentially of RE-610™ and polyethylene glycol (PEG).

In the preferred embodiment of the chemical solution, the composition of the method M1 is formulated with component concentration ranges as follows: wherein the at least one zinc (Zn) ion source is provided in a concentration range of approximately 5 g/L to approximately 10 g/L (preferably approximately 10 g/L), wherein the at least one complexing agent for complexing the plurality of Zn ions is provided in a concentration range of approximately 10 g/L to approximately 30 g/L (preferably approximately 20 g/L), wherein the at least one copper (Cu) ion source is provided in a concentration range of approximately 5 g/L to approximately 20 g/L (preferably approximately 10 g/L), wherein the at least one complexing agent for complexing the plurality of Cu ions is provided in a concentration range of approximately 40 g/L to approximately 100 g/L (preferably approximately 80 g/L), wherein the at least one pH adjuster is provided in a concentration range of approximately 10 g/L to approximately 20 g/L (preferably approximately 15 g/L), wherein the at least one wetting agent is provided in a concentration range of approximately 0.01 g/L to approximately 0.1 g/L (preferably approximately 0.02 g/L), wherein the volume of water is provided in a volume range of up to and including approximately 1 L, wherein the solution flow rate is in a range of approximately less than 3 L/min, wherein the solution stir rate is in a range of approximately less than 700 rpm, and wherein the wafer rotation rate is in a range of approximately less than or equal to 700 rpm.

Also, the preferred embodiment involves the following process parameters ranges: wherein the at least one pH adjuster adjusts the chemical solution to a pH range of approximately 7 to approximately 14 (preferably in a pH range of approximately 10 to approximately 12), wherein the chemical solution maybe maintained in a temperature range of approximately 16° C. to approximately 35° C. (preferably at a temperature of approximately 24° C.), wherein the Cu surface 20 is immersed for a duration in a range of approximately 30 seconds to approximately 120 seconds (preferably for a duration of approximately 60 sec), wherein the Cu—Zn alloy thin film 30 is formed having a thickness in a range of approximately 10 nm (100 Å) to approximately 200 nm (2 Å) (preferably having a thickness of approximately 30 nm), and wherein the formed Cu-rich Cu—Zn alloy thin film 30 has a low Zn content of approximately 10 at. % and a high Cu content of approximately 90 at. % (preferably~1–2 at. % Zn :~98–99 at. % Cu).

FIG. 10 flowcharts, by example only, a method M2 of fabricating a semiconductor device, having a first interim reduced-oxygen copper-zinc (Cu—Zn) alloy thin film 30 formed on a copper (Cu) surface 20, the Cu surface 20 having been formed by CVD, PVD, PECVD or electroplating, and a second interim reduced-oxygen Cu—Zn alloy thin film 31 formed on either a Cu-fill 26 or a Cu layer 27, both films 30, 31 being formed by electroplating the Cu surface 20 and either the Cu-fill 26 or a Cu layer 27, respectively, in a chemical solution, initially comprising the steps of: providing a semiconductor substrate 4 having a Cu surface 20, an optional barrier layer 10, and an optional underlayer 19 formed in a via 6, as indicated by block 2001; providing a chemical solution, the chemical solution comprising: at least one zinc (Zn) ion source for providing a plurality of Zn ions; at least one copper (Cu) ion source for providing a plurality of Cu ions; at least one complexing agent for complexing the plurality of Cu ions; at least one pH adjuster; at least one wetting agent for stabilizing the chemical solution, all being dissolved in a volume of deionized (DI) water, as shown by block 2002; electroplating the Cu surface 20 in the chemical solution, thereby forming a first interim Cu—Zn alloy thin film 30 on the Cu surface 20, as indicated by block 2003; rinsing the first interim Cu—Zn alloy thin film 30 in a solvent, as indicated by block 2004; drying the first interim Cu—Zn alloy thin film 30 under a gaseous flow, for instance, under a gaseous nitrogen flow (GN$_2$), as indicated by block 2005; annealing the first interim Cu—Zn alloy thin film 30 formed on the Cu surface 20 in a temperature range such as 150° C. to 450° C. (preferably in a temperature of approximately 150° C. to approximately 250° C.), wherein the annealing step is performed for a duration range of approximately 0.5 minutes to approximately 60 minutes, thereby reducing the oxygen impurity concentration to a level less than that which is detectable (i.e.,~0.1 at. %) in the alloy thin film 30, thereby modifying the grain structure by increasing the grain size of both the alloy thin film 30 as well as the Cu surface 20, and thereby forming a first interim reduced-oxygen Cu—Zn alloy thin film 30, as indicated by block 2006; filling the via 6 with Cu on the first interim reduced-oxygen Cu—Zn alloy thin film 30, thereby forming a Cu-fill 26, as indicated by block 2007; and annealing the Cu-fill 26, the first interim reduced-oxygen Cu—Zn alloy thin film 30, the Cu surface 20, the optional barrier layer 10, and the optional underlayer 19, the underlayer 19 comprising at least one material selected from a group consisting essentially of tin (Sn) and palladium (Pd), as indicated by block 2008. The chemical solution may also further comprises at least one complexing agent for complexing the plurality of Zn ions also being dissolved in the volume of DI water.

The method M2 subsequently comprises the steps of: subjecting the annealed Cu-fill 26, the first interim reduced-oxygen Cu—Zn alloy thin film 30, the Cu surface 20, the optional barrier layer 10, and the optional underlayer 19 to a process selected from a group consisting essentially of: process (1) comprising the steps of: immersing the annealed Cu-fill 26 in the chemical solution, thereby forming a second interim Cu—Zn alloy thin film 31 on the annealed Cu-fill 26; rinsing the second interim Cu—Zn alloy thin film 31 in a solvent; drying the second interim Cu—Zn alloy thin film 31 under a gaseous flow, for instance, under a gaseous nitrogen flow (GN$_2$); annealing the second interim Cu—Zn alloy thin film layer 31 formed on the Cu-fill 26 in a temperature range such as 150° C. to 450° C. (preferably in a temperature of approximately 150° C. to approximately 250° C.), wherein the annealing step is performed for a duration range of approximately 0.5 minutes to approximately 60 minutes, thereby reducing the oxygen impurity concentration to a level less than that which is detectable (i.e.,~0.1 at. %) in the second interim Cu—Zn alloy thin film layer 31, thereby modifying the grain structure by increasing the grain size of both the second interim Cu—Zn alloy thin film layer 31 as well as the Cu fill 26, and thereby forming a reduced-oxygen mixed Cu—Zn interface 25', thereby diffusing a plurality of Zn ions from the second interim Cu—Zn alloy thin film 31 into the Cu-fill 26, and thereby forming a second interim reduced-oxygen Cu—Zn alloy thin film 32 comprising the second interim Cu—Zn alloy thin film 31 as well as an upper portion of the Cu-fill 26; and planarizing, by a technique such as chemical mechanical polishing (CMP), the second interim reduced-oxygen Cu—Zn alloy thin film 32, the Cu-fill 26, the first interim reduced-oxygen Cu—Zn alloy thin film 30, the Cu surface 20, the optional barrier layer 10, and the optional underlayer 19, thereby completing formation of an encapsulated dual-inlaid interconnect structure 35, as indicated by block 2009(1); and process (2) comprising the steps of: planarizing the Cu-fill 26, the first interim reduced-oxygen Cu—Zn alloy thin film 30, the Cu surface 20, the optional barrier layer 10, and the optional underlayer 19, thereby forming an intermediate planarized surface 28; depositing a Cu layer 27, in a thickness range of approximately 3 nm to approximately 50 nm, on the intermediate planarized surface 28; immersing the Cu layer 27 in the chemical solution, thereby forming a second interim Cu—Zn alloy thin film 31 on the Cu layer 27; rinsing the second interim Cu—Zn alloy thin film 31 in a solvent; drying the second interim Cu—Zn alloy thin film 31 under a gaseous flow, for instance, under a gaseous nitrogen flow (GN$_2$); annealing the second interim Cu—Zn alloy thin film 31 formed on the Cu layer 27, thereby diffusing a plurality of Zn ions from the second interim Cu—Zn alloy thin film 31 through the Cu layer 27 and into the Cu-fill 26, and thereby forming a second interim reduced-oxygen Cu—Zn alloy thin film 32 comprising the second interim Cu—Zn alloy thin film 31, the Cu layer 27, and an upper portion of the Cu-fill 26; and planarizing, by a technique such as chemical mechanical polishing (CMP), the annealed second interim reduced-oxygen Cu—Zn alloy thin film 32, the Cu layer 27, the Cu-fill 26, the first interim reduced-oxygen Cu—Zn alloy thin film 30, the Cu surface 20, the optional barrier layer 10, and the optional underlayer 19, thereby completing formation of an encapsulated dual-inlaid interconnect structure 35, as indicated by block 2009(2); and completing formation of the semiconductor device, as indicated by block 2010. In the second embodiment of the present invention, the annealing step also facilitates doping of the interim Cu—Zn alloy thin film layer 30 with desirable Sn and Pd impurities from the underlayer 19 which structurally stabilizes the film layer 30 by internally increasing its bond strengths.

FIG. 11 illustrates, in perspective view, an electroplating apparatus using the unique nontoxic aqueous Cu—Zn chemical solution, in accordance with the present invention. In particular, the electroplating step (3) of FIG. 3 step, as indicated by block 2003 in FIG. 10, may be performed in this electroplating apparatus comprising: (a) a cathode-wafer 21; (b) an anode 22; (c) an electroplating vessel 23 such as a beaker; and (d) a voltage source 24. The cathode-wafer 21 may comprise a Cu surface 20. The anode 22 may comprise at least one material selected from a group consisting essentially of copper (Cu), a copper-platinum alloy (Cu—Pt), titanium (Ti), platinum (Pt), a titanium-platinum alloy (Ti—Pt), anodized copper-zinc alloy (Cu—Zn, i.e., brass), and platinized titanium (Pt/Ti), and platinized copper-zinc (Pt/Cu—Zn, i.e., platinized brass). The brass alloy may be anodized to form a thin oxide film in situ using the chemical solution 99 prior to electroplating the cathode-wafer 21. The anodized brass anode also provides the following benefits: (1) a uniform current density distribution on the cathode-wafer; (2) a uniform Cu—Zn alloy thin film formation, (3) a uniform Zn distribution across the Cu—Zn alloy thin film surface, and (4) a uniform Zn distribution across the Cu—Zn alloy thin film thickness. The present invention electroplating method also comprises direct voltage in the range of approximately 1 V to approximately 4 V (preferably in a voltage range of approximately 1 V to approximately 2 V); and a direct current in the range of approximately 0.01 A to approximately 0.2 A (preferably in a current range of approximately 0.1 A to approximately 0.15 A). Differential pulse conditions selected from a group consisting essentially of forward pulses, reverse pulses, combinations of forward and reverse pulses, combinations of direct current, and combinations of direct voltage may also be applied.

Further, the Zn-doping in the resultant Cu—Zn alloy thin film 30 may be controlled in the present invention by varying electroplating conditions. For example, increasing the at least one zinc (Zn) ion source concentration slowly increases Zn-doping, increasing the at least one copper (Cu) ion source concentration slowly decreases Zn-doping, increasing the solution flow rate increases Zn-doping, increasing the pH decreases cathodic efficiency with respect to Zn and thereby decreases Zn-doping, increasing the immersing duration slowly decreases Zn-doping, using a Cu anode decreases Zn-doping, using a brass anode increases Zn-doping, increasing the voltage increases the Zn-doping, and increasing the current increases the Zn-doping.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

What is claimed:

1. A semiconductor device, having a first interim reduced-oxygen copper-zinc alloy (Cu—Zn) thin film formed on a copper (Cu) surface and a second interim reduced-oxygen Cu—Zn alloy thin film formed on a Cu-fill, both films being formed by electroplating the Cu surface and the Cu-fill, respectively, in a chemical solution, comprising:

a semiconductor substrate having a via; and
   an encapsulated dual-inlaid interconnect structure formed and disposed in said via, said interconnect structure comprising:
      at least one Cu surface formed in said via;
      a first interim reduced-oxygen Cu—Zn alloy thin film formed and disposed on the at least one Cu surface;
      a Cu-fill formed and disposed on said first interim reduced-oxygen Cu—Zn alloy thin film; and
      a second interim reduced-oxygen Cu—Zn alloy thin film formed and disposed on the Cu-fill.

2. A semiconductor device, having a first interim reduced-oxygen copper-zinc (Cu—Zn) alloy thin film formed on a copper (Cu) surface and a second interim reduced-oxygen Cu—Zn alloy thin film formed on a Cu-fill, both films being formed by electroplating the Cu surface and the Cu-fill, respectively, in a chemical solution, fabricated by a method comprising the steps of:

providing a semiconductor substrate having a Cu surface formed in a via;
   providing a chemical solution;
   electroplating the Cu surface in the chemical solution, thereby forming a first interim Cu—Zn alloy thin film on the Cu surface;
   rinsing the first interim Cu—Zn alloy thin film in a solvent;
   drying the first interim Cu—Zn alloy thin film under a gaseous flow;
   annealing the first interim Cu—Zn alloy thin film formed on the Cu surface, thereby forming a first interim reduced-oxygen Cu—Zn alloy thin film;
   filling the via with Cu on the first interim reduced-oxygen Cu—Zn alloy thin film, thereby forming a Cu-fill;
   annealing the Cu-fill, the first interim reduced-oxygen Cu—Zn alloy thin film, and the Cu surface;
   subjecting the annealed Cu-fill, the first interim reduced-oxygen Cu—Zn alloy thin film, and the Cu surface to a process selected from a group consisting essentially of:
      process (1) comprising the steps of:
         electroplating the annealed Cu-fill in the chemical solution, thereby forming a second interim Cu—Zn alloy thin film on the annealed Cu-fill;
         rinsing the second interim Cu—Zn alloy thin film in a solvent;
         drying the second interim Cu—Zn alloy thin film under a gaseous flow;
         annealing second interim Cu—Zn alloy thin film formed on the Cu-fill, thereby diffusing a plurality of Zn ions from the second interim Cu—Zn alloy thin film into the Cu-fill, and thereby forming a second interim reduced-oxygen Cu—Zn alloy thin film comprising the second interim Cu—Zn alloy thin film as well as an upper portion of the Cu-fill; and planarizing second interim reduced-oxygen Cu—Zn alloy thin film, the Cu-fill, the first interim reduced-oxygen Cu—Zn alloy thin film, and the Cu surface, thereby forming an encapsulated dual-inlaid interconnect structure; and process (2) comprising the steps of:
planarizing the Cu-fill, the first interim reduced-oxygen Cu—Zn alloy thin film, and the Cu surface, thereby forming an intermediate planarized surface;

depositing a Cu layer on the intermediate planarized surface;

electroplating the Cu layer in the chemical solution, thereby forming a second interim Cu—Zn alloy thin film on the Cu layer;

rinsing the second interim Cu—Zn alloy thin film in a solvent;

drying the second interim Cu—Zn alloy thin film under a gaseous flow;

annealing second interim Cu—Zn alloy thin film formed on the Cu layer, thereby diffusing a plurality of Zn ions from the second interim Cu—Zn alloy thin film through the Cu layer and into the Cu-fill, and thereby forming a second interim reduced-oxygen Cu—Zn alloy thin film comprising the second interim Cu—Zn alloy thin film, the Cu layer, and an upper portion of the Cu-fill; and planarizing the annealed second interim reduced-oxygen Cu—Zn alloy thin film, the Cu layer, the Cu-fill, the first interim reduced-oxygen Cu—Zn alloy thin film, and the Cu surface, thereby forming an encapsulated dual-inlaid interconnect structure; and completing formation of the semiconductor device.

3. A device, as recited in claim 2,
wherein the chemical solution is nontoxic and aqueous, and
wherein the chemical solution comprises:
at least one zinc (Zn) ion source for providing a plurality of Zn ions;
at least one copper (Cu) ion source for providing a plurality of Cu ions;
at least one complexing agent for complexing the plurality of Cu ions;
at least one pH adjuster;
at least one wetting agent for stabilizing the chemical solution, all being dissolved in a volume of deionized (DI) water.

4. A device, as recited in claim 3, wherein the at least one zinc (Zn) ion source comprises at least one zinc salt selected from a group consisting essentially of zinc acetate $((CH_3CO_2)_2Zn)$, zinc bromide $(ZnBr_2)$, zinc carbonate hydroxide $(ZnCO_3 \cdot 2Zn(OH)_2)$, zinc dichloride $(ZnCl_2)$, zinc citrate $((O_2CCH_2C(OH)(CO_2)CH_2CO_2)_2Zn_3)$, zinc iodide $(ZnI_2)$, zinc L-lactate $((CH_3CH(OH)CO_2)_2Zn)$, zinc nitrate $(Zn(NO_3)_2)$, zinc stearate $((CH_3(CH_2)_{16}CO_2)_2Zn)$, zinc sulfate $(ZnSO_4)$, zinc sulfide $(ZnS)$, zinc sulfite $(ZnSO_3)$, and their hydrates.

5. A device, as recited in claim 3, wherein the at least one copper (Cu) ion source comprises at least one copper salt selected from a group consisting essentially of copper(I) acetate $(CH_3CO_2Cu)$, copper(II) acetate $((CH_3CO_2)_2Cu)$, copper(I) bromide $(CuBr)$, copper(II) bromide $(CuBr_2)$, copper(II) hydroxide $(Cu(OH)_2)$, copper(II) hydroxide phosphate $(Cu_2(OH)PO_4)$, copper(I) iodide $(CuI)$, copper(II) nitrate $((CuNO_3)_2)$, copper(II) sulfate $(CuSO_4)$, copper(I) sulfide $(Cu_2S)$, copper(II) sulfide $(CuS)$, copper(II) tartrate $((CH(OH)CO_2)_2Cu)$, and their hydrates.

6. A device, as recited in claim 2,
wherein said electroplating step comprises using an electroplating apparatus, and
wherein said electroplating apparatus comprises:
(a) a cathode-wafer;
(b) an anode;
(c) an electroplating vessel; and
(d) a voltage source.

7. A device, as recited in claim 6,
wherein the cathode-wafer comprises the Cu surface, and
wherein the anode comprises at least one material selected from a group consisting essentially of copper (Cu), a copper-platinum alloy (Cu—Pt), titanium (Ti), platinum (Pt), a titanium-platinum alloy (Ti—Pt), an anodized copper-zinc alloy (Cu—Zn), a platinized titanium (Pt/Ti), and a platinized copper-zinc (Pt/Cu—Zn).

8. A device, as recited in claim 2,
wherein said semiconductor substrate further comprises a barrier layer formed in the via under said Cu surface, and
wherein the barrier layer comprises at least one material selected from a group consisting essentially of titanium silicon nitride $(Ti_xSi_yN_z)$, tantalum nitride (TaN), and tungsten nitride $(W_xN_y)$.

9. A device, as recited in claim 8,
wherein said semiconductor substrate further comprises an underlayer formed on the barrier layer,
wherein said underlayer comprises at least one material selected from a group consisting essentially of tin (Sn) and palladium (Pd), and
wherein said Cu surface is formed over said barrier layer and on said underlayer.

10. A device, as recited in claim 9,
wherein said underlayer comprises a thickness range of approximately 10 Å to approximately 30 Å,
wherein said barrier layer comprises a thickness range of approximately 10 Å to approximately 30 Å,
wherein said Cu surface comprises a thickness range of approximately 100 Å to approximately 300 Å, and
wherein said first interim Cu—Zn alloy thin film comprises a thickness range of approximately 100 Å to approximately 2000 Å.

* * * * *

UNITED STATES PATENT AND TRADEMARK OFFICE
CERTIFICATE OF CORRECTION

PATENT NO.    : 6,515,368 B1  Page 1 of 1
DATED         : February 4, 2003
INVENTOR(S)   : Lopatin et al.

It is certified that error appears in the above-identified patent and that said Letters Patent is hereby corrected as shown below:

Column 2,
Lines 14-16, delete "[1]Peter Van Zant, Microchip Fabrication: A Practical Guide to Semiconductor Processing, $3^{rd}$ Ed., p. 397 (1997). [2]Id., at 392."; and
Line 23, insert -- [1]Peter Van Zant, Microchip Fabrication: A Practical Guide to Semiconductor Processing, $3^{rd}$ Ed., p. 397 (1997). [2]Id., at 392. --

Column 8,
Line 1, delete "$(O_2CCH_2C(OH)(CO_2)CH_2CO_2)_2Zn_3)$" replace with
-- $((O_2CCH_2C(OH)(CO_2)CH_2CO_2)_2Zn_3)$ --.

Signed and Sealed this

Sixth Day of April, 2004

JON W. DUDAS
*Acting Director of the United States Patent and Trademark Office*